(12) United States Patent
Morgott et al.

(10) Patent No.: US 7,542,494 B2
(45) Date of Patent: Jun. 2, 2009

(54) DEVICE WITH A RADIATION-EMITTING SEMICONDUCTOR COMPONENT AND PROCEDURE FOR THE TEMPERATURE STABILIZATION OF A RADIATION-EMITTING SEMICONDUCTOR COMPONENT

(75) Inventors: Stefan Morgott, Regensburg (DE); Ulrich Steegmüller, Regensburg (DE); Klaus Friepes, Regensburg (DE)

(73) Assignee: Osram Opto Semiconductor GmbH, Regensburg (DE)

( * ) Notice: Subject to any disclaimer, the term of this patent is extended or adjusted under 35 U.S.C. 154(b) by 142 days.

(21) Appl. No.: 11/065,653

(22) Filed: Feb. 24, 2005

(65) Prior Publication Data

US 2005/0199890 A1 Sep. 15, 2005

(30) Foreign Application Priority Data

Feb. 25, 2004 (DE) ........................ 10 2004 009 588
Jan. 28, 2005 (DE) ........................ 10 2005 004 145

(51) Int. Cl.
*H01S 3/04* (2006.01)
*H01S 3/13* (2006.01)

(52) U.S. Cl. ..................................... 372/34; 372/29.01
(58) Field of Classification Search .............. 372/29.01, 372/34, 36
See application file for complete search history.

(56) References Cited

U.S. PATENT DOCUMENTS

| | | | |
|---|---|---|---|
| 5,490,490 A * | 2/1996 | Weber et al. ................. | 123/697 |
| 5,740,191 A | 4/1998 | Kasper et al. | |
| 5,926,495 A * | 7/1999 | Guch, Jr. ..................... | 372/75 |
| 6,449,295 B1 | 9/2002 | Ostromek | |
| 6,641,775 B2 * | 11/2003 | Vigliotti et al. ............. | 264/618 |
| 6,741,629 B1 * | 5/2004 | Garnache et al. .............. | 372/96 |
| 6,778,576 B1 * | 8/2004 | Acklin et al. ............... | 372/50.1 |
| 7,054,340 B1 | 5/2006 | Hillmer et al. | |
| 2001/0024462 A1 * | 9/2001 | Nakahara et al. ............. | 372/43 |
| 2003/0095736 A1 * | 5/2003 | Kish et al. .................... | 385/14 |
| 2003/0095737 A1 * | 5/2003 | Welch et al. .................. | 385/14 |
| 2003/0227694 A1 * | 12/2003 | Hosoya et al. .............. | 359/820 |
| 2004/0165641 A1 * | 8/2004 | Garnache et al. .............. | 372/97 |
| 2004/0228377 A1 * | 11/2004 | Deng et al. .................... | 372/34 |
| 2004/0259237 A1 * | 12/2004 | Kellogg et al. ........... | 435/287.1 |

FOREIGN PATENT DOCUMENTS

| | | |
|---|---|---|
| DE | 19755457 A1 | 6/1999 |
| EP | 1 369 722 | 12/2003 |
| WO | WO 00/41349 | 7/2000 |
| WO | WO 03/069749 A1 | 8/2003 |

OTHER PUBLICATIONS

R. Diehl., "High-Power Diode Lasers", Springer, 2000, pp. 173-218.

* cited by examiner

*Primary Examiner*—Minsun Harvey
*Assistant Examiner*—Phillip Nguyen
(74) *Attorney, Agent, or Firm*—Cohen Pontani Lieberman & Pavane LLP

(57) ABSTRACT

A device having at least one radiation-emitting semiconductor component (1), the semiconductor component being assigned at least one electrical heating element (2) designed for heating the semiconductor component. Furthermore, a method for the temperature stabilization of the operating temperature of a radiation-emitting semiconductor component (1) of a device is specified, the semiconductor component being assigned an electrical heating element (2), by means of which the semiconductor component is heated when the operating temperature of the semiconductor component falls below a predetermined desired value of the operating temperature. The semiconductor component can be assigned a temperature sensor (4) for monitoring the operating temperature of the semiconductor component.

32 Claims, 11 Drawing Sheets

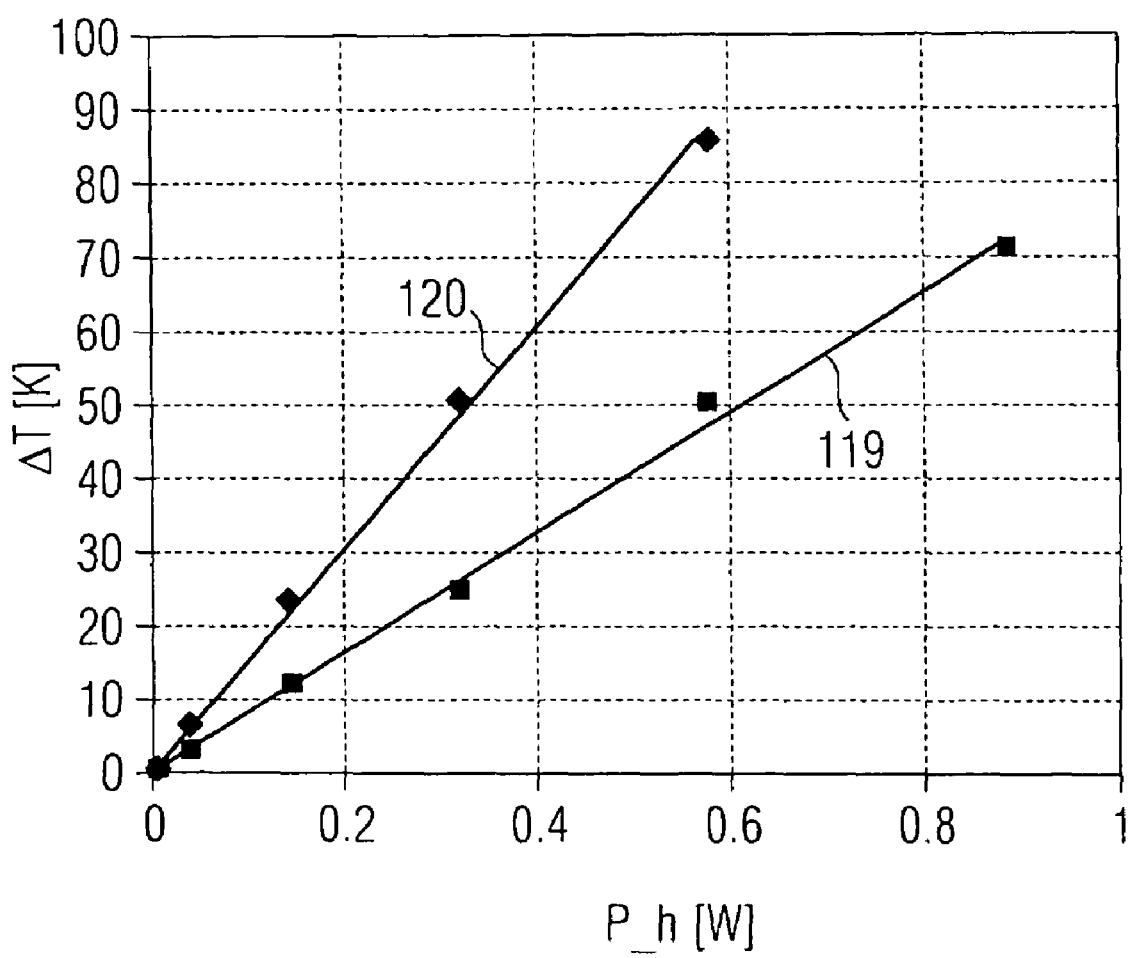

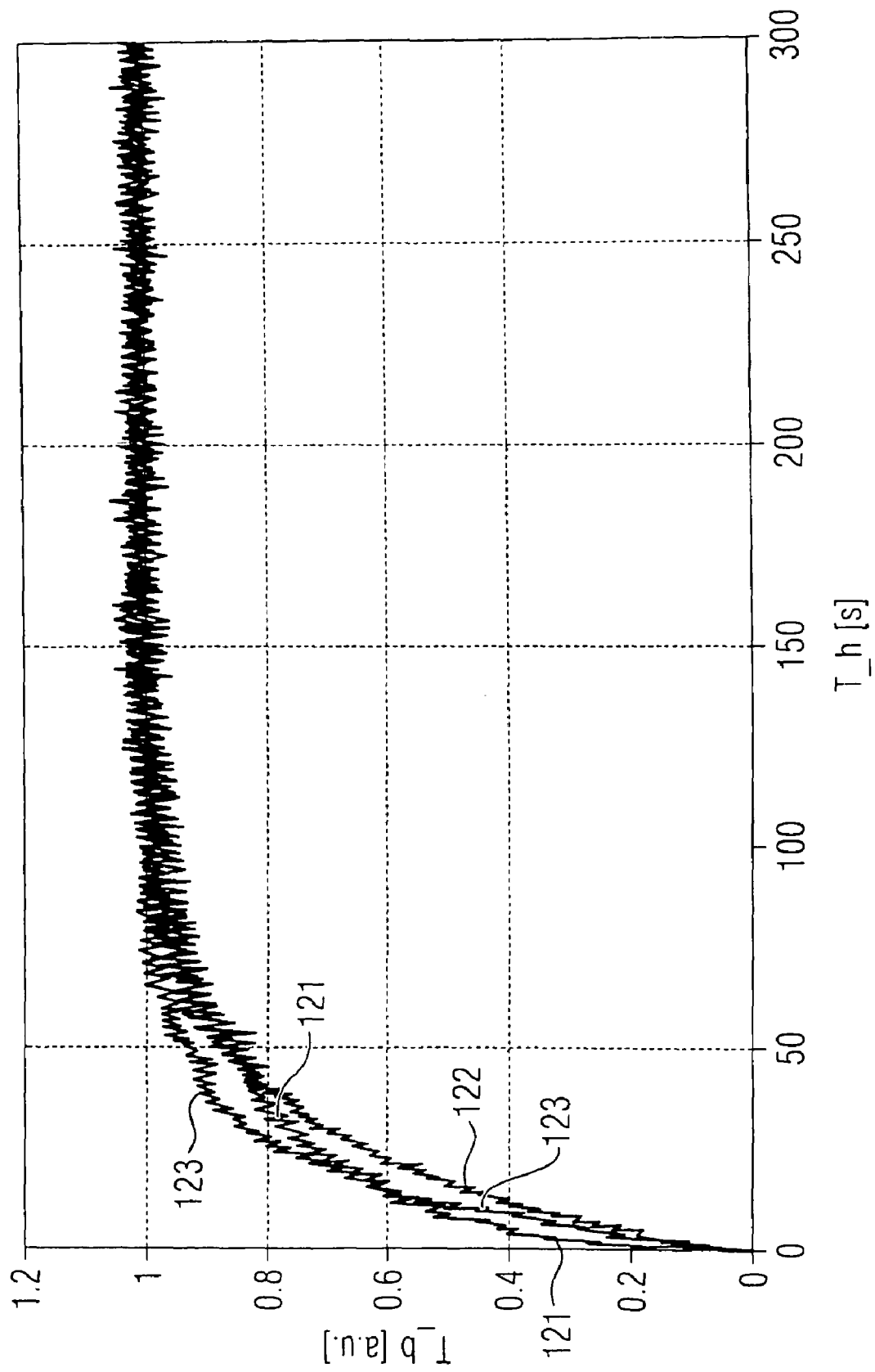

DEVICE WITH A RADIATION-EMITTING SEMICONDUCTOR COMPONENT AND PROCEDURE FOR THE TEMPERATURE STABILIZATION OF A RADIATION-EMITTING SEMICONDUCTOR COMPONENT

RELATED APPLICATIONS

The present patent application claims the priorities of the German patent applications DE 10 2004 009 588.4 filed Feb. 25, 2004 and DE 10 2005 004 145.0 filed Jan. 28, 2005, the entire disclosure content of which is hereby explicitly incorporated by reference into the present application.

FIELD OF THE INVENTION

The invention relates to a device having a radiation-emitting semiconductor component and a method for the temperature stabilization of a radiation-emitting semiconductor component.

BACKGROUND OF THE INVENTION

The peak wavelength of the radiation emitted by a laser diode of a device of this type is influenced, as is known, by the operating temperature of the semiconductor component, which depends on the ambient temperature of the semiconductor component. Changes in the ambient temperature can thus lead to fluctuations in the peak wavelength of the semiconductor component. Such fluctuations of the peak wavelength are often undesirable, however. The peak wavelength of a laser diode component is therefore quite often stabilized by means of additional measures. In the case of edge emitting laser diodes, by way of example, a spectral filter, for instance a Bragg grating, as in the case of DFB Distributed Feedback) or DBR Distributed Bragg Reflector) lasers, for wavelength stabilization may be integrated into the component. However, lasers of this type are usually only suitable for comparatively low optical output powers. In the case of semiconductor components with an external resonator, for instance with a vertical emission direction (e.g. VECSEL: Vertical External Cavity Surface Emitting Laser), it is possible, for wavelength stabilization, to arrange a diffraction grating or a Bragg fiber as filter element in the resonator. This enables resonator-internal losses to be increased in a targeted manner such that the peak wavelength of the component is comparatively stable. Furthermore, a laser diode may be correspondingly cooled for wavelength stabilization, e.g. by means of a Peltier element or cooling water.

However, the above measures for wavelength stabilization are comparatively complicated and/or cost intensive. A spectral filter, for instance, has to be integrated into a laser diode structure during production, and a diffraction grating or a Bragg fiber has to be arranged and aligned in the resonator. Furthermore, Peltier elements are comparatively cost-intensive, and cooling water circuits, which usually have a high space requirement, not only have high costs but are also comparatively complicated to realize.

SUMMARY OF THE INVENTION

One object of the present invention is to specify a device having a radiation-emitting semiconductor component whose peak wavelength can be stabilized in a simplified manner.

Another object of the invention is for the device to be able to be realized cost-effectively and to be able to be used reliably with a stabilized peak wavelength over a wide ambient temperature range.

It is a further object of the invention to specify a simplified method for wavelength stabilization of a radiation-emitting semiconductor component.

This and other objects are attained in accordance with one aspect of the present invention directed to a device having at least one radiation-emitting semiconductor component, with at least one electrical heating element designed for heating the semiconductor component being assigned to the semiconductor component.

By heating the semiconductor component by means of the heating element, it is possible to reduce the change in the operating temperature of the semiconductor component relative to the change in the ambient temperature over a predetermined ambient temperature range in which the semiconductor component is intended to be operated in. The operating temperature of the semiconductor component can thus be stabilized to an operating temperature range that is completely covered by the predetermined ambient temperature range in such a way that the ambient temperature range has temperatures lying outside the operating temperature range of the temperature-stabilized semiconductor component. Fluctuations in the operating temperature of the semiconductor component can thus be reduced, as a result of which, on account of the temperature dependence of the peak wavelength of a radiation generated by the semiconductor component, the fluctuation of the peak wavelength is reduced during operation of the semiconductor component over the predetermined ambient temperature range.

Spectral filters integrated in the semiconductor component that are complicated to produce and/or cost-intensive or external filter elements that are complicated in terms of alignment, as well as cost-intensive cooling, can thus advantageously be dispensed with. In particular, the electrical heating element may be embodied as an external heating element arranged outside the semiconductor component. An electrical heating element furthermore advantageously facilitates the heating control, for instance on account of a simplified mounting of the heating element in the device.

Semiconductor components for a device of this type can thus advantageously be fabricated in a cost-effective standard process and the peak wavelength can be individually stabilized for semiconductor components fabricated in the same way, by means of the respectively assigned heating element.

It should be noted that the ambient temperature or the ambient temperature range and the operating temperature or the operating temperature range of a non-temperature-stabilized, in particular an unheated, semiconductor component, are related to each other. Although the operating temperature of a non-temperature-stabilized semiconductor component generally differs from the ambient temperature on account of the heat arising during operation, it can be critically influenced by said ambient temperature. The ambient temperature in any event represents a lower limit for the operating temperature of a non-temperature-stabilized semiconductor component if the heat loss during operation of the semiconductor component, for instance on account of low-power operation, is negligible and additional cooling measures are dispensed with. In the case of the invention, by contrast, the operating temperature of the semiconductor component can be kept above the ambient temperature by electrical heating of the component, so that the ambient temperature does not represent a lower limit for the operating temperature.

Another aspect of the present invention is directed to a method for the temperature stabilization of the operating temperature of a radiation-emitting semiconductor component, wherein an electrical heating element is assigned to the semiconductor component, by means of which the semiconductor component is heated when the operating temperature of the semiconductor component falls below a predetermined desired value of said operating temperature. This makes it possible, as already mentioned above, to keep the operating temperature of the semiconductor component in an operating temperature range that is narrowed relative to the predetermined ambient temperature range as operating temperature range.

In one refinement, when the predetermined desired value of the operating temperature of the semiconductor component is exceeded, the heating power of the heating element is reduced or the heating element is switched off. Excessive heating of the semiconductor component and the risk of damage to the overheated semiconductor component are thus reduced.

In a further refinement, the semiconductor component is designed for generating radiation having a peak wavelength that varies in a fluctuation range over a predetermined ambient temperature range in which the semiconductor component is intended to be operated in. The fluctuation range need not necessarily be continuous, rather an abrupt change in the peak wavelength may also occur.

The fluctuation range of the peak wavelength of the heated semiconductor component can be narrowed relative to the fluctuation range of the unheated semiconductor component with an operating temperature that is critically influenced by the ambient temperature.

In particular, a width of the fluctuation range of the peak wavelength may be reduced, by heating the semiconductor component by means of the heating element, from a first width of the unheated semiconductor component to a second width of the heated semiconductor component, the second width being smaller than the first width. The fluctuation range of the first width preferably completely covers that of the second width. The fluctuation range can be narrowed in such a way that the second width amounts to 60%, preferably 55%, or less of the first width.

What is regarded as the width in this case is the magnitude of the difference between the smallest and the largest peak wavelength over the operating temperature range of the semiconductor component. The width of the fluctuation interval of the unheated semiconductor component is at least approximately determined by the difference between the maximum and the minimum peak wavelength assumed by the radiation emitted by the semiconductor component for an operating temperature of the semiconductor component over the entire ambient temperature range. The same applies correspondingly to the width of the fluctuation interval of the temperature-stabilized, heated semiconductor component.

The fluctuation of the peak wavelength of the semiconductor component can thus advantageously be reduced overall by means of targeted temperature stabilization using the electrical heating element. Consequently, the peak wavelength of the semiconductor component is stabilized.

The semiconductor component can be operated in an ambient temperature range comprising temperatures less than and greater than 0° C., in particular from −40° C. to 85° C. What can be achieved by means of the electrical heating is that the operating temperature of the semiconductor component is at temperatures, in particular without exception, in the range greater than 0° C., in particular in the range of from 20° C. to 85° C. An operating temperature window of the semiconductor component can be narrowed from a first window of the unheated semiconductor component, for instance having a width of 125 K to a second window of the heated semiconductor component, for instance having a width of 65 K. Temperatures of this type may occur in outside applications of the semiconductor component, for instance in a device in a vehicle context.

In a further refinement a temperature sensor, such as an electrical one, is assigned to the semiconductor component for monitoring the operating temperature of the semiconductor component. The operation of the electrical heating element can be controlled by means of the temperature sensor, for instance by means of a signal generated in the temperature sensor or a signal determined at the temperature sensor.

An NTC element with a negative temperature coefficient Negative Temperature Coefficient) for instance an NTC thermistor (thermistor: a temperature-dependent resistor), is particularly suitable as the temperature sensor.

The operating temperature of the semiconductor component is determined by means of the temperature sensor. When the temperature falls below the predetermined desired value, it is possible to instigate heating of the semiconductor component by means of the heating element. If the desired value is exceeded, the heating power is expediently reduced or the heating element is switched off. If the operating temperature already lies above the desired value, then the heating element is preferably not operated. This heating control may be effected, if appropriate, by means of an external evaluation element that monitors the operating temperature of the semiconductor component determined by means of the temperature sensor and compares it with the desired value.

In a further preferred refinement, a detector element is assigned to the semiconductor component for detecting the radiation emitted by the semiconductor component, which can be designed for detecting radiation having wavelengths in a predetermined, continuous, detection range. Detector elements of this type are often provided in a sensor device with a semiconductor component as transmitter and the detector as receiver, the detection range being as narrow as possible in order to avoid undesirable ambient light influences that often cause detector signal noise.

The detection range in a conventional device of this type is often chosen such that it comprises the fluctuation range of the peak wavelength over the ambient temperature range in order to ensure detection of the radiation of the unheated semiconductor component with an operating temperature over essentially the entire ambient temperature range. In the case of the invention, by contrast, the detection range may be designed in such a way that the fluctuation range of the peak wavelength of the unheated semiconductor component has wavelengths outside the detection range and the detection range covers, preferably completely, the fluctuation range of the peak wavelength of the temperature-stabilized semiconductor component. The detector element can thus be embodied with a narrower-band detection range in a device having a temperature-stabilized semiconductor component compared with a device having a non-temperature-stabilized semiconductor component and ambient light influences on a detector signal can advantageously be reduced. By way of example, particularly suitable radiation detectors are photodiodes, for instance PIN or avalanche photodiodes (APD: Avalanche Photodiode), preferably based on Si, whose detection range is adapted by corresponding filters to the semiconductor component or the fluctuation range of the peak wavelength of the heated semiconductor component.

In a further refinement, the semiconductor component is embodied as a semiconductor laser component, in particular a high-power laser component. On account of the comparatively narrowband emission spectra of semiconductor laser components, the temperature dependence of the peak wavelength often becomes apparent in particularly pronounced fashion in the case of semiconductor laser components. The semiconductor laser component may be designed for example as an edge emitting laser diode or as a laser diode bar. In this case, a laser diode bar comprises a plurality of laser diode structures (laser diode channels) that are formed in monolithically integrated fashion and are arranged on a common substrate. Furthermore, the semiconductor component may be embodied as a surface emitting semiconductor component, in particular semiconductor laser component. By way of example, the surface emitting semiconductor component may be designed as a vertically emitting semiconductor laser component with an internal resonator (VCSEL: Vertical Surface Emitting Laser) or with an external resonator (VECSEL). The semiconductor laser component can be provided for pulsed operation, in particular in a sensor device, having a detector element assigned to the component.

In a further refinement, the semiconductor component is arranged on a carrier, for instance a conductor board, such as a printed circuit board, for example. The heating element can be likewise arranged on the carrier. This facilitates efficient heating of the semiconductor component, in particular by means of a comparatively closely adjacent arrangement of the heating element and the semiconductor component. Furthermore, the heating element and/or, if appropriate, the temperature sensor can be of surface-mountable design (SMD: Surface Mountable Device), thereby facilitating mounting of the heating element on the carrier and a compact design of the device.

In a further refinement, the heating element is embodied as a heating resistor. By applying a voltage to the heating resistor, heat can correspondingly be generated by means of current flow through the heating resistor and the semiconductor component can be heated.

In a further refinement, the heating element is integrated in the carrier of the semiconductor component. The carrier may thus already be provided with an integrated heating element, as a result of which it is possible to dispense with an additional arrangement of a separate heating element on the carrier. The carrier can have a multilayer structure for this purpose and the heating element is integrated as a heating resistance layer in the multilayer structure. What is particularly suitable for this purpose is a multilayer printed circuit board having a heating resistance layer that is patterned into one or more heating resistance track(s), for instance running in meandering fashion, and/or contains Cu.

In a further refinement, the heating element is arranged between the carrier and the semiconductor component or the semiconductor component is arranged on the heating element. Such proximity between heating element and semiconductor component facilitates efficient, areal heating of the semiconductor component.

In a further refinement of the invention, a submount is arranged between the carrier and the semiconductor component. Such a submount makes it possible to reduce the risk of shading of the radiation emitted by the semiconductor component by an edge of the carrier.

In a development of the invention, the submount is designed as heating element or the submount contains the heating element. In this case, the heating element is a heating resistance region, which may be formed in the submount. A heating resistance region of this type may be realized by means of implantation, for instance proton implantation, into a region of the submount. For this purpose, the submount contains a semiconductor material, for instance Si. The heating resistance region can be embodied in the submount near to that surface of the submount which faces the semiconductor component, and/or can be electrically connected to said surface.

In a further refinement, the heating element is electrically insulated from the semiconductor component. It is thus possible for the heating element and the semiconductor component to be electrically driven separately. In particular, the heating element and the semiconductor component can advantageously be operated independently of one another.

In a further refinement, the heating element is separately thermally conductively connected to the semiconductor component. The heating efficiency can thus be increased. For this purpose, by way of example, it is possible to provide a thermally conductive connector, for instance containing Cu, which thermally conductively connects the semiconductor component and the heating element.

In a development of the invention, the temperature sensor is separately thermally conductively connected to the semiconductor component. On account of a thermally conductive connection, the temperature can be monitored more efficiently since the risk of a deviation of the operating temperature determined by means of the temperature sensor from an actual operating temperature of the semiconductor component is reduced. In order to improve the thermal linking, it is possible, by way of example, to provide a further thermal connecting conductor, for instance containing Cu, which thermally conductively connects the semiconductor component and the temperature sensor.

In a further refinement of the invention, the semiconductor component is heated via the material of the carrier. In particular, heat can be supplied through an electrically insulating basic material of the carrier. The formation of separate thermal connecting conductors can thus be dispensed with.

BRIEF DESCRIPTION OF THE DRAWINGS

FIG. 12 shows a comparison of the temperature determination of the operating temperature of a semiconductor laser component by means of two different methods.

FIG. 13 shows the thermal transient behavior of the semiconductor laser component for three heating variants.

DETAILED DESCRIPTION OF THE INVENTION

Elements which are identical, are of identical type or act identically are provided with the same reference symbols in the Figures.

Figure 1A:
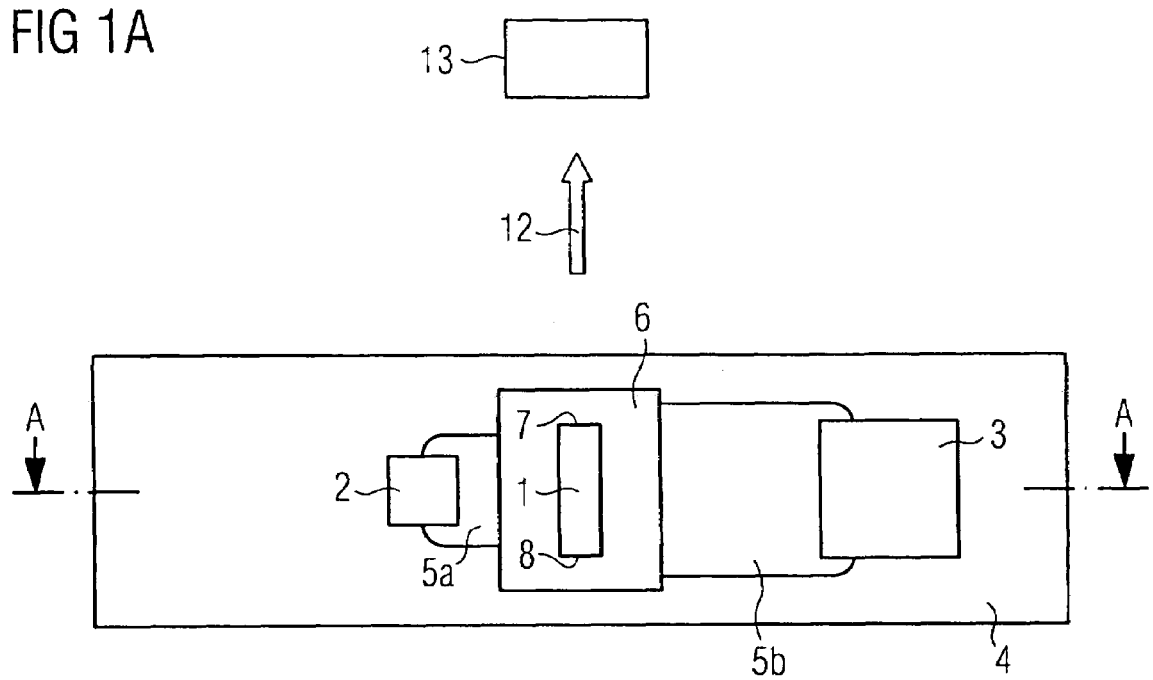
FIG. 1A is a schematic plan view of a first exemplary embodiment of a device according to the invention.
Figure 1B:
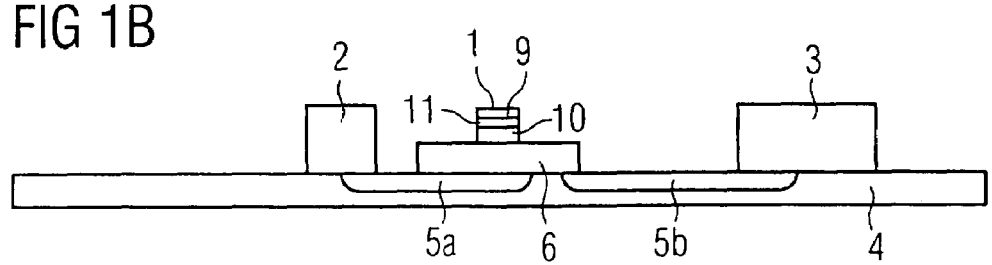
FIG. 1B is a corresponding sectional view along the line A-A of FIG. 1A.

FIG. 1A is a schematic plan view of a first exemplary embodiment of a device according to the invention and FIG. 1B is a schematic sectional view taken along the line A-A of FIG. 1A.

A radiation-emitting semiconductor component 1 of the device is assigned an electrical heating element 2 designed for heating the semiconductor component. The heating element and the semiconductor component are arranged with an, in particular electrical, temperature sensor 3 on an, in particular common, carrier 4. A submount 6 is arranged between the semiconductor component 1 and the carrier 4, which submount, on account of the semiconductor component being arranged in elevated fashion relative to the carrier by means of the submount, reduces the shading of a radiation 12 emitted by the semiconductor component by the carrier 4.

The semiconductor component 1 is furthermore assigned a detector element 13, for instance a PIN or avalanche photodiode, for detecting a radiation 12 generated by the semiconductor component. In contrast to the illustration, the detector element may likewise be arranged on the carrier 4. A compact design of a sensor device of this type is thus facilitated.

A separate thermally conductive connection is preferably formed between the heating element and the semiconductor component and/or the semiconductor component and the temperature sensor. By way of example, for this purpose, a first thermal connecting conductor 5a is thermally conductively connected to the heating element 2 and the semiconductor component 1 and a second connecting conductor 5b is thermally conductively connected to the semiconductor component and the temperature sensor. The connecting conductors are preferably not directly conductively connected thermally. By way of example, the connecting conductors 5a and 5b contain a metal, for instance Cu.

Furthermore, the carrier is preferably embodied as a printed circuit board (PCB) for instance. The illustration of conductor tracks of the printed circuit board and also electrical terminals of the heating element 2, the semiconductor component 1 and the temperature sensor 3 has been dispensed with for the sake of clarity. Particularly preferably, the semiconductor component, the heating element and the temperature sensor can be connected and/or driven via conductor tracks of the printed circuit board, in particular in a manner electrically isolated from one another. The thermal connecting conductors are preferably integrated in the carrier.

As an alternative, however, it is also possible to dispense with the thermal connecting conductors. The semiconductor component is then preferably heated via the material of the carrier. In particular, heat may be supplied to the semiconductor component in this case by means of an electrically insulating basic material, e.g. a plastics material, of the carrier.

The electrical heating element, the semiconductor component and/or the temperature sensor are preferably embodied in surface-mountable fashion and may be soldered onto the carrier, for example. By way of example, the temperature sensor is embodied as a surface-mountable NTC thermistor and/or the electrical heating element is embodied as a surface-mountable heating resistor. The semiconductor component is preferably mounted on the carrier without an additional housing (chip on board).

A thermally conductive connection between the electrical heating element 2 and/or the temperature sensor 3 and the semiconductor component 1 may advantageously be achieved by means of the submount 6. For this purpose, the submount is expediently designed with a correspondingly high thermal conductivity. By way of example, the submount contains a semiconductor material, for instance Si, or a metal, such as Cu, or an alloy, for instance CuWo. Materials of this type may be distinguished not only by a comparatively high thermal conductivity but also by good matching to the coefficient of thermal expansion of the semiconductor component, thereby reducing the risk of thermally induced strains in the semiconductor component.

It should be noted that the connecting conductors 5a or 5b need not necessarily be arranged, as illustrated, on that side of the carrier which faces the semiconductor component. A connecting conductor may also extend from that side of the carrier on which the semiconductor component is arranged to the opposite side of the carrier with respect to the semiconductor component. The heating element and/or the temperature sensor may thus be arranged in a simplified manner on the opposite side of the carrier with respect to the semiconductor component and be thermally conductively connected to the semiconductor component by means of one or a plurality of thermal connecting conductor(s), the operating efficiency of the device advantageously not being critically reduced despite the arrangement of this type.

If appropriate, a thermally conductive connection may also be effected via the carrier, preferably by means of an electrically insulating basic material, for instance a plastic, of the carrier.

The semiconductor component 1 preferably has an active zone 9 provided for generating radiation, said active zone being formed for example in a semiconductor body 11 arranged on a substrate 10. The substrate 10 is expediently fabricated from an epitaxial substrate of the semiconductor body 11.

The semiconductor component may be embodied for example as a semiconductor laser component, in particular for pulsed operation. The semiconductor laser component is preferably embodied as an edge emitting laser diode. In this case, preferably opposite side areas 7 and 8 (reflector areas) of the semiconductor laser component delimit an optical resonator (e.g. a Fabry-Perot resonator) of the component.

A GaAs-based semiconductor body, in particular grown on a GaAs epitaxial substrate, is particularly suitable for generating radiation in the infrared spectral region.

If the semiconductor component is embodied as a laser diode bar, then a plurality of semiconductor bodies 11 are preferably arranged next to one another on the common substrate 10.

By means of the temperature sensor 3, the operating temperature of the semiconductor component is monitored in such a way that when the operating temperature of the semiconductor component falls below a predetermined desired value of said operating temperature, the semiconductor component is heated by means of the electrical heating element 3. If the operating temperature exceeds the predetermined desired value, then the heating power of the heating element is reduced or the heating element is switched off. Preferably, the semiconductor component and the temperature sensor are arranged directly adjacent to one another, thereby facilitating the monitoring of the operating temperature.

For the purpose of monitoring the operating temperature, the latter may be determined, for example by way of the known temperature dependence of the resistance of the NTC thermistor, by means of the temperature sensor and be regulated by means of a regulating circuit, for instance a transistor circuit, which is arranged on the carrier, if appropriate, and preferably compares the operating temperature determined with the desired value.

With respect to an operating temperature of the semiconductor component that varies over a predetermined ambient temperature range, the fluctuation range of the operating-temperature-dependent peak wavelength of the semiconductor component can thus be reduced by virtue of the semiconductor component being heated in a targeted manner and temperature-stabilized by means of the electrical heating element.

The detection range of the detector element 13 may thus advantageously be embodied with a narrower band than a fluctuation interval of the peak wavelength of the radiation 12 over the ambient temperature range. The fluctuation range of the peak wavelength of the temperature-stabilized semiconductor component is preferably completely covered by the detection range of the detector element. This results in an optimized ratio of the detector signal generated from the radiation 12 to a background noise, caused for instance by ambient light influences.

The operating temperature range of the semiconductor component may be stabilized for example from a predetermined ambient temperature range with temperatures of −40° C. to 85° C. to an operating temperature range of 20° C. to 85° C. The peak wavelength of the semiconductor component is consequently stabilized on account of the temperature dependence of the peak wavelength.

The temperature dependence of the peak wavelength may be 0.3 nm/K, particularly in the case of an edge emitting laser diode for generating infrared radiation, for instance in a spectral range of 800 to 1,000 nm. In an ambient temperature window having the width 125 K, for instance from −40° C. to 85° C., as operating temperature range of the unheated semiconductor component, this means a considerable fluctuation in the peak wavelength in an interval having a width of approximately 38 nm, the peak wavelength increasing as the operating temperature rises. If the operating temperature is stabilized by means of electrical heating to a narrower temperature window compared with the above range, such as one having the width of 65 K, for instance from 20° C. to 85° C., then the width of the fluctuation range of the peak wavelength can be reduced for instance to a width of approximately 20 nm for an operating temperature window of 65 K width. Even with a detection range having a width of approximately 20 nm that has been narrowed by means of corresponding filters, the radiation generated by the semiconductor component can thus be reliably detected by means of the detector element during operation of the semiconductor component over the ambient temperature range. Ambient light influences on the detector signal are advantageously reduced by virtue of the narrow detection range.

Figure 2A:
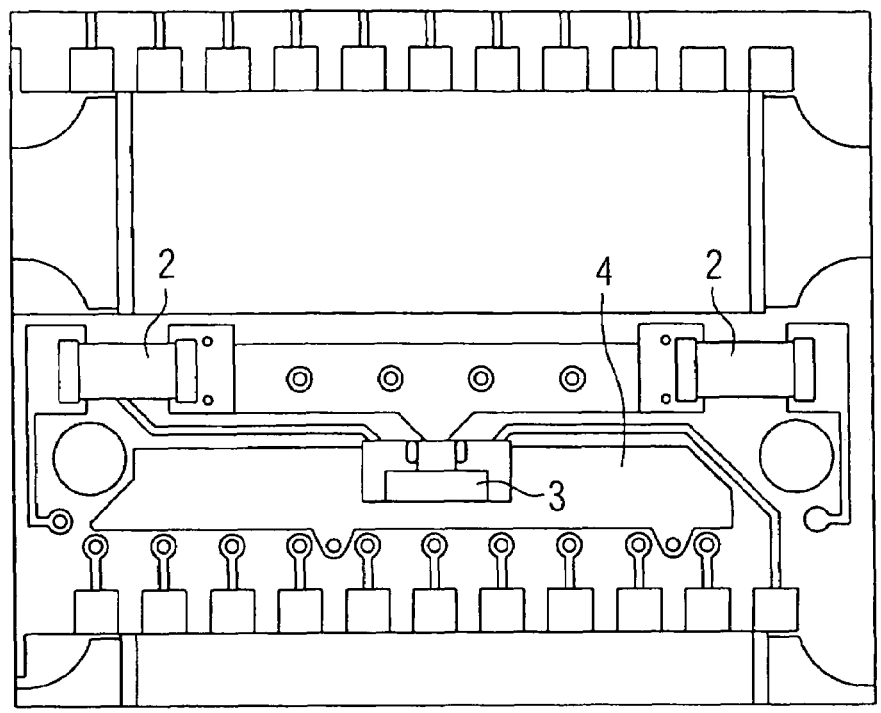
FIG. 2A is a schematic plan view of a second exemplary embodiment of a device according to the invention from above.
Figure 2B:
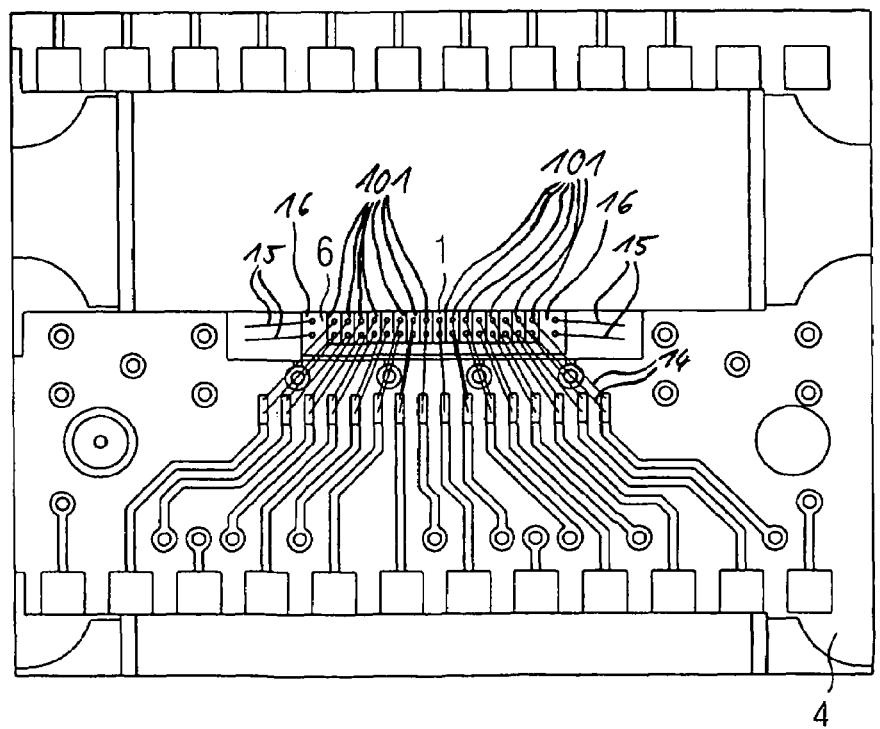
FIG. 2B is a schematic plan view from below.

FIGS. 2A and 2B show two schematic plan views to illustrate a second exemplary embodiment of a device according to the invention. This exemplary embodiment essentially corresponds to the exemplary embodiment shown in FIGS. 1A and 1B. In contrast thereto, two electrical surface-mountable heating resistors 2, for example each having a resistance of 56 Ω, for instance of the well known 1 206 design, are provided in the FIG. 2 embodiment. The resistors 2 are, in the same way as the NTC thermistor, which is used as the temperature sensor 3, arranged on the opposite side of the carrier 4 with respect to the semiconductor component 1. The NTC thermistor is, for example, a surface-mountable 1 kΩ NTC thermistor having a resistance of 1 kΩ at room temperature (298 K). In this case, the semiconductor component 1 is embodied as a laser diode array (laser diode bar), in particular as a pulse laser diode array, i.e. a laser diode array which is intended or designed for pulsed operation. Further details on laser diode bars are described more closely for example in the textbook "Roland Diehl, High Power Diode Lasers, Springer (2000)", the disclosure content of which is hereby explicitly incorporated by reference in the present application (see in particular pages 173 to 218 therein).

The array may be designed in such a way that the individual laser diode channels 101 of the array can be driven separately from one another or the individual channels can only be operated jointly. In the latter case, the channels are connected in parallel and for this purpose have a contact common to all the channels and a mating contact common to all the channels. For separate driving of the individual channels, it is possible, by way of example, to provide a mating contact that is conductively connected to all the channels, the individual channels 101 each having a separate individual contact via which the current flow through the respective channel can be regulated. The individual channels can then be operated independently of one another via the respective individual contact.

In the FIG. 2 embodiment, two bonding wires 14 for electrical contact connection are assigned on each of the, for example, sixteen laser diode channels 101 of the array. The opposite pole of the diode contact connection is produced by means of bonding wires 15, e.g. by means of four bonding wires, which are conductively connected to the semiconductor component 1 and electrical contacts on the carrier 4, for instance conductor tracks of a PCB carrier, for example via a, for instance metal-containing, connection layer 16 arranged on the submount 6, preferably between the semiconductor component 1 and the submount 6. FIGS. 2A and 2B show plan views of the carrier 4 from the side of the semiconductor component 1 in FIG. 2A and the opposite side of the carrier 4 with respect thereto in FIG. 1B.

Figure 3A:
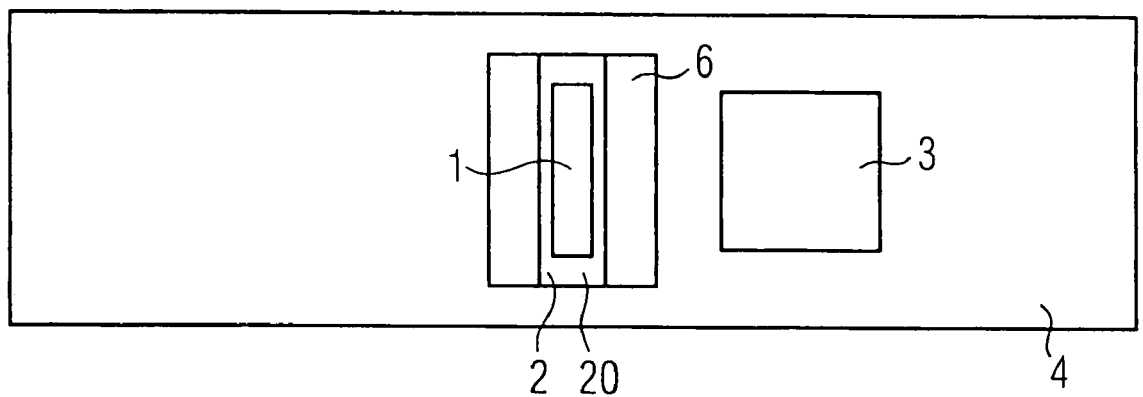
FIG. 3A is a schematic plan view of a third exemplary embodiment of a device according to the invention and FIG. 3B is a corresponding schematic sectional view.
Figure 3B:
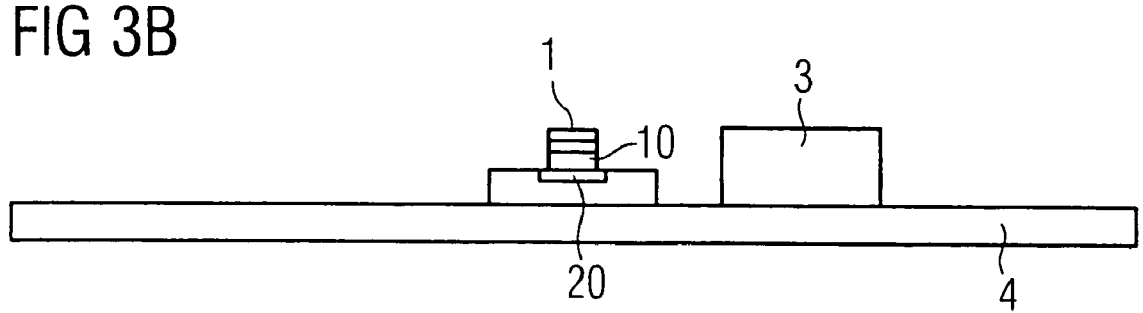

FIG. 3A shows a schematic plan view of a third exemplary embodiment of a device according to the invention and a corresponding schematic sectional view in FIG. 3B. The exemplary embodiment in accordance with FIG. 3A essentially corresponds to that shown in FIG. 1A. In contrast thereto, a discrete electrical heating element has been dispensed with. Furthermore, an illustration of the detector element and the thermal connecting conductors has been dispensed with for reasons of clarity, but of course they can be provided in the third exemplary embodiment as well.

In contrast to the exemplary embodiment in accordance with FIG. 1A, the semiconductor component 1 in FIG. 3A is arranged on the heating element 2. In particular, the heating element may be arranged between the carrier and the semiconductor component. The heating element 2 is preferably integrated as heating resistance region 20 in the submount 6. By way of example, the heating resistance region 20 is produced by means of proton implantation in a region of a Si submount. Arranging the heating resistance region 20, as illustrated in FIG. 3B, directly at the surface is not absolutely necessary. Rather, the heating resistance region may also be formed as a buried region in the submount, in particular below that surface of the submount which faces the semiconductor component. Accordingly, the heating resistance region 20 may be spaced apart from the semiconductor component 1 and/or the substrate 10.

The heating resistance region preferably has a lateral extent that is greater than the lateral extent of the semiconductor component, thereby facilitating areal and efficient electrical heating of the semiconductor component in direct proximity to the semiconductor component compared with discrete heating elements.

Figure 4:
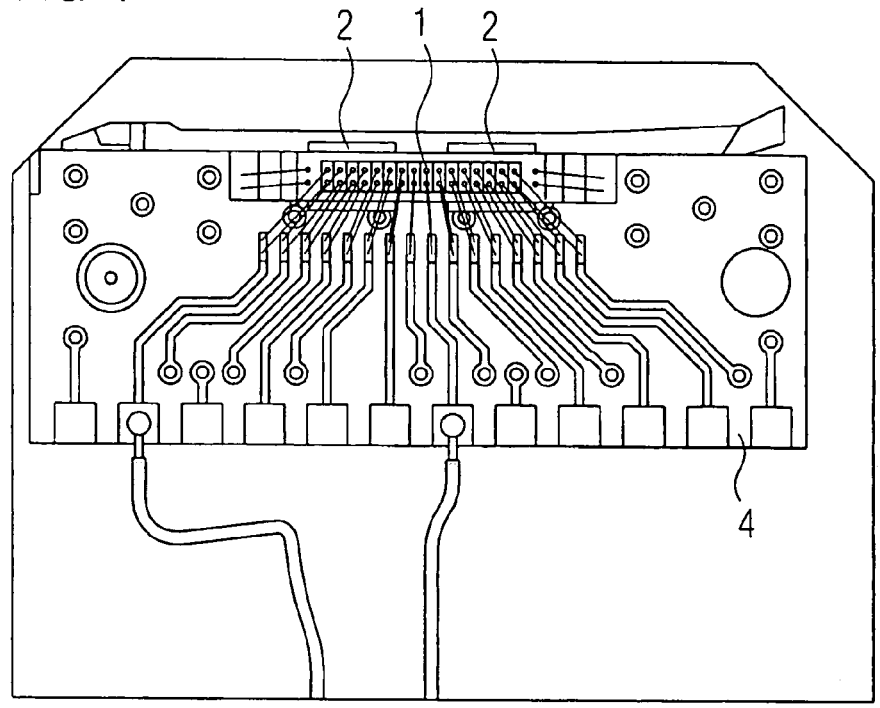
FIG. 4 is a schematic plan view of a fourth exemplary embodiment of a device according to the invention.

FIG. 4 shows a schematic plan view of a fourth exemplary embodiment of a device according to the invention. The semiconductor component 1 is embodied in accordance with FIG. 2A as a pulsed laser diode array. Arranged between the carrier 4 and the semiconductor component 1 are two electrical heating elements 2, for example in the form of two surface-mountable heating resistors, which are electrically insulated from the semiconductor component. As in FIG. 2A, the temperature sensor is arranged on the opposite side of the carrier with respect to the semiconductor component. Such an arrangement of the electrical heating element may be used for simulation and for efficiency experiments for a heating element integrated in the submount, for instance in accordance with FIG. 3A.

Figure 5A:
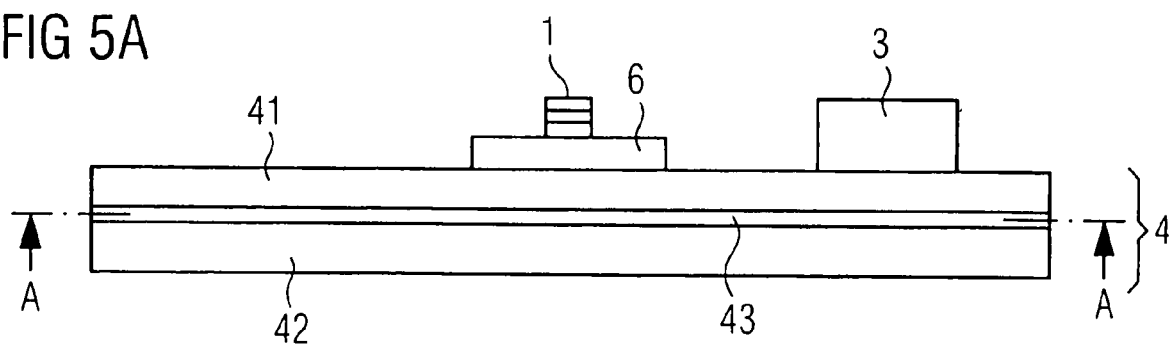
FIG. 5A is a schematic sectional view of a fifth exemplary embodiment of a device according to the invention.
Figure 5B:
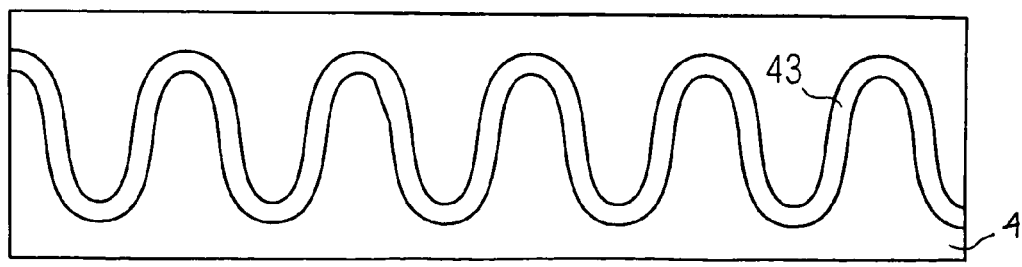
FIG. 5B is a corresponding schematic sectional plan view of a section along the line A-A in FIG. 5B.

FIG. 5A shows a schematic sectional view of a fifth exemplary embodiment of a device according to the invention and FIG. 5B shows a corresponding schematic sectional plan view of a section along the line A-A in FIG. 5A.

The fifth exemplary embodiment essentially corresponds to the third exemplary embodiment from FIG. 3A. In contrast thereto, the electrical heating element is integrated in the carrier 4. In this case, the carrier 4 has a multilayer structure having a first layer 41 on the side facing the semiconductor component 1, and a second layer 42 on the side remote from the semiconductor component, between which a heating resistance layer 43 is arranged.

The heating resistance layer contains Cu, for example, and/or runs as a meandering track, for instance, as shown in FIG. 5B. The heating resistance layer 43 is thermally conductively connected to the semiconductor component 1 via the first layer 41 and the submount 6. The first layer 41 and/or the second layer 42 is preferably embodied in electrically insulating fashion. The thermally conductive connection to the submount or the semiconductor component may be effected in particular via the electrically insulating material of the first layer 41.

Furthermore, if appropriate additionally or alternatively, provision may be made of a thermally conductive connector that extends through the first layer 41 and is thermally conductively connected, for example via the submount 6, to the semiconductor component 1 and the heating resistance layer, preferably directly.

In this embodiment, the electrical heating element may advantageously be fabricated in a manner already integrated with the carrier 4. Additional arrangement of a discrete heating element or formation of the submount as heating element may thus be dispensed with.

Figure 6:
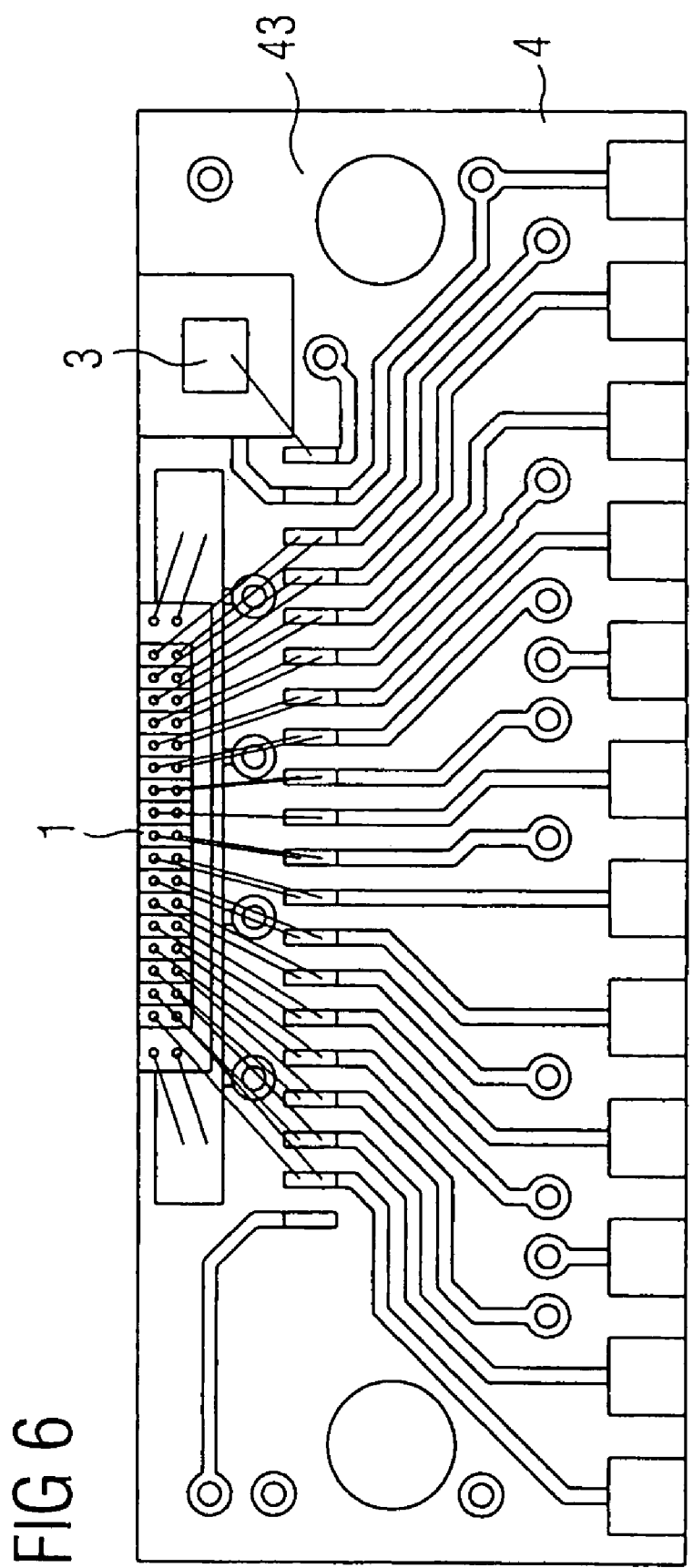
FIG. 6 shows a schematic plan view of a sixth exemplary embodiment of a device according to the invention.

FIG. 6 shows a schematic plan view of a sixth exemplary embodiment of a device according to the invention, which essentially corresponds to the exemplary embodiment shown in FIG. 4. In contrast thereto, a heating resistance layer 43, in accordance with the explanations with respect to FIGS. 5A and 5B, is integrated in the carrier 4 and the temperature sensor 3 and the semiconductor component 1 are arranged on the same side of the carrier.

The relationships explained with reference to the following Figures were determined on a semiconductor laser component, for instance in accordance with that shown in FIG. 2A.

Figure 7:
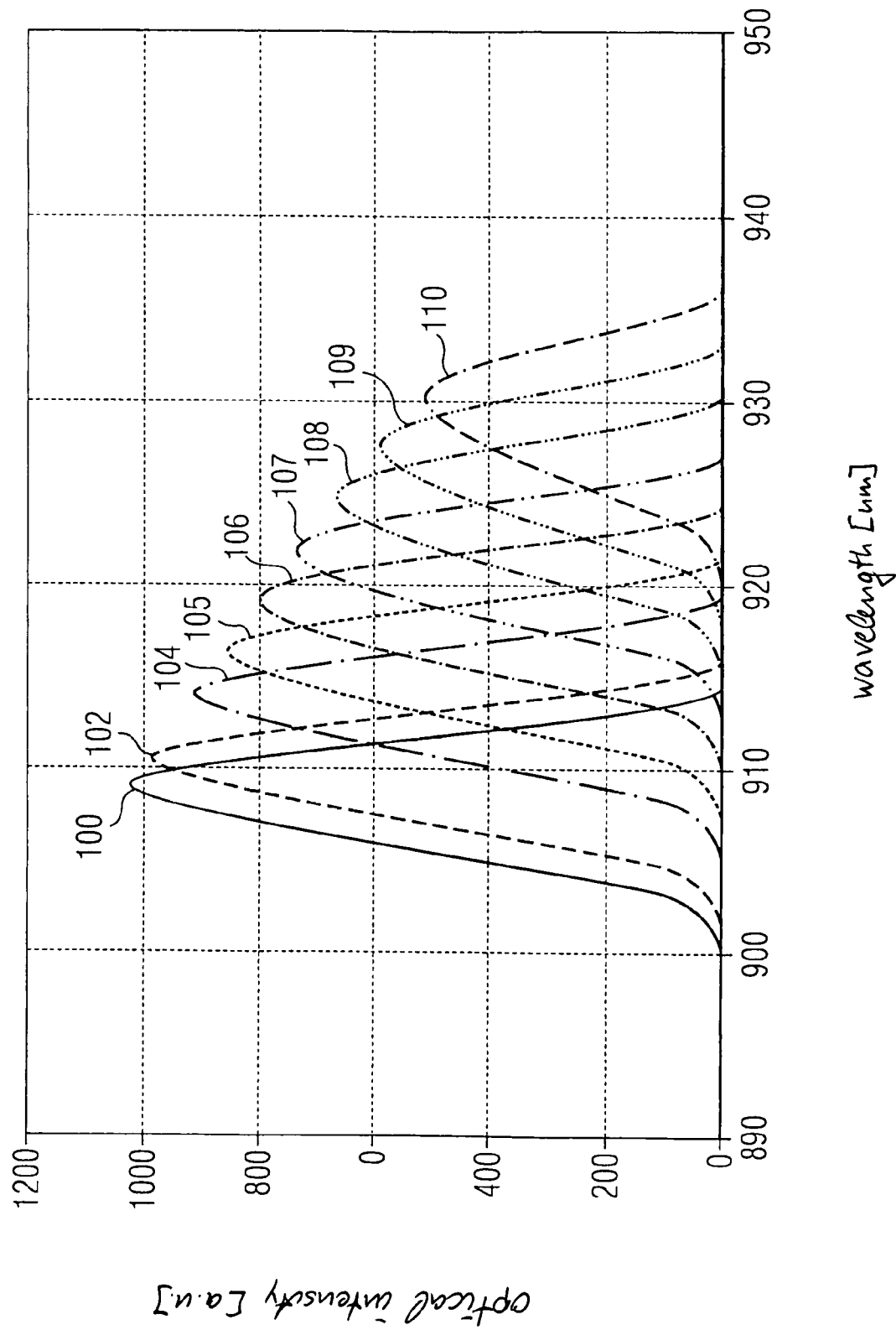
FIG. 7 shows the temperature dependence of the emission spectrum of a semiconductor laser component, for instance in accordance with the exemplary embodiment from FIG. 6, as a function of the electrical heating power.

FIG. 7 shows the temperature dependence of the emission spectrum of the semiconductor laser component. In this case, a multilayer structure with a meandering resistance track, for instance made of Cu, having a resistance of 65 Ω at room temperature was used for electrically heating the semiconductor laser component.

FIG. 7 plots the optical intensity of the radiation generated by the semiconductor laser component in arbitrary units and as a function of the wavelength of the radiation generated by the semiconductor laser component in nm. The semiconductor laser component is designed in particular for generating infrared radiation, for instance having a wavelength greater than or equal to 900 nm. Various hearing voltages were applied to the heating resistance track for heating purposes. In this case, the following heating voltages correspond to the following curves of the emission distribution of the component:

| Heating voltage in V | Curve |
|---|---|
| 0 | 100 |
| 2 | 102 |
| 4 | 104 |
| 5 | 105 |
| 6 | 106 |
| 7 | 107 |
| 8 | 108 |
| 9 | 109 |
| 10 | 110 |

The temperature dependence of the peak wavelength—the wavelength of the emission maximum of the respective distribution—is clearly discernible in this case, larger hearing voltages generally corresponding to higher temperatures and the peak wavelength shifting toward higher wavelengths for rising voltages. The emission distribution flattens with rising voltages.

Figure 8:
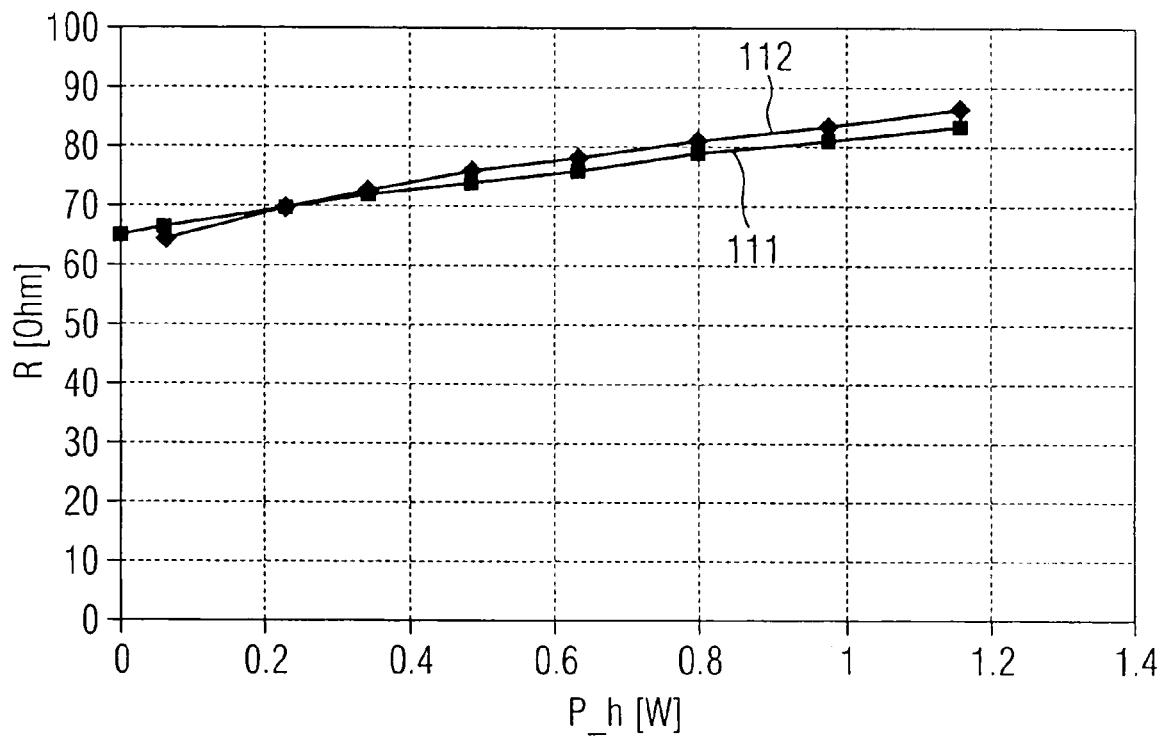
FIG. 8 shows the temperature dependence of the resistance of a heating resistance layer.

FIG. 8 illustrates the temperature dependence of the resistance R of a heating resistance layer made of Cu in a multilayer structure in ohms as a function of the heating power P_h in watts. At room temperature, the resistance is approximately 65 Ω. For the curve 111, the temperature dependence of the resistance R on the temperature change ΔT—relative to room temperature—was determined by means of the relationship $$R(T)=R_N(1+\alpha \cdot \Delta T)$$

where α=0.004 1/K and $R_N$=65 Ω. For the curve 112, the resistance R was determined from the heating voltage and the measured heating current. The profiles of the resistance obtained in these different ways match to a good approximation.

In the case of a surface-mountable heating resistor, for instance of the type mentioned above (cf. the explanations with respect to FIG. 2) where α=0.0001 1/K, the temperature dependence of the resistance is generally negligibly small.

Figure 9:
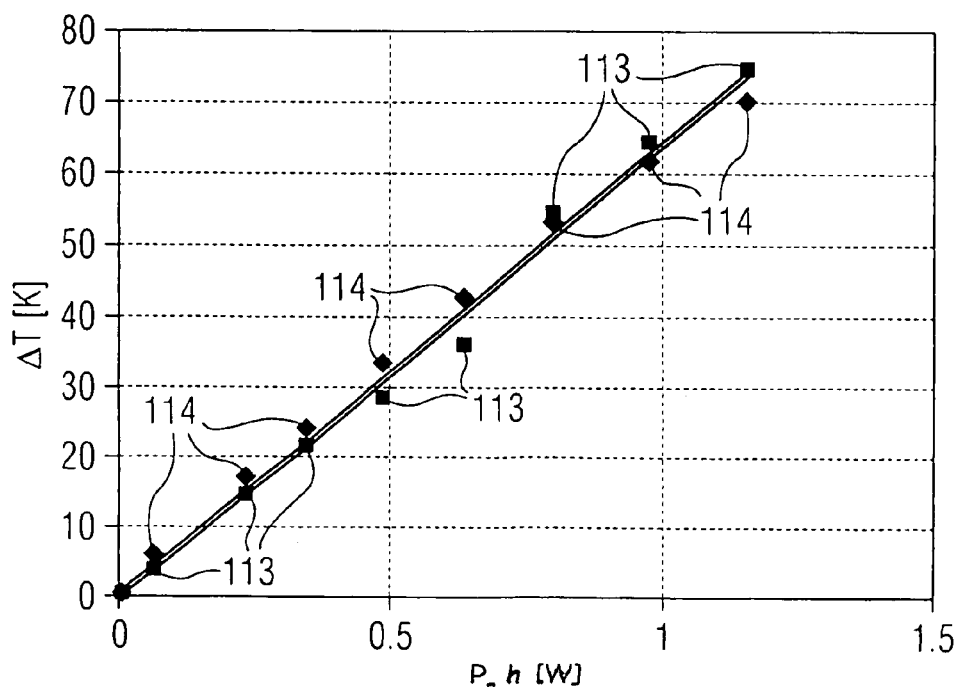
FIG. 9 shows a comparison of the temperature change in the operating temperature of a semiconductor laser component as a function of the heating power for a semiconductor laser component heated by various methods.

FIG. 9 shows a comparison of the temperature determination of the operating temperature of the semiconductor laser component, heated with the heating power P_h by means of a heating resistance layer integrated in the carrier, using the known temperature dependence of the peak wavelength and using a 1 kΩ NTC thermistor as temperature sensor. The temperature change ΔT relative to room temperature $T_N$ is plotted as a function of the heating power. The data points 113 of the operating temperature were determined from the temperature dependence of the peak wavelength, which changes approximately by 0.30 nm per K in the case of an infrared emitting semiconductor laser component. In the case of the 1 kΩ NTC thermistor, the temperature T of the temperature sensor was determined by means of the measured temperature-dependent resistance R(T), which is linked to T by the relationship $$T = \left[\frac{1}{B} \cdot \ln\left(\frac{R(T)}{R_N}\right) + \frac{1}{T_N}\right].$$

In this case: B=3263 1/K, $R_N$=1 kΩ and $T_N$=298 K. These results are reproduced by the data points 114.

It is evident from FIG. 9 that the temperature of the semiconductor laser component determined by means of the peak wavelength essentially matches the temperature of the temperature sensor, so that the operating temperature of the semiconductor laser component can be reliably determined by means of the temperature sensor. A best fit straight line for a linear relationship between the data points 113 results as $$y=64.085 \cdot x$$

and a best fit straight line for the data points 114 results as $$y=64.114 \cdot x$$

Figure 10:
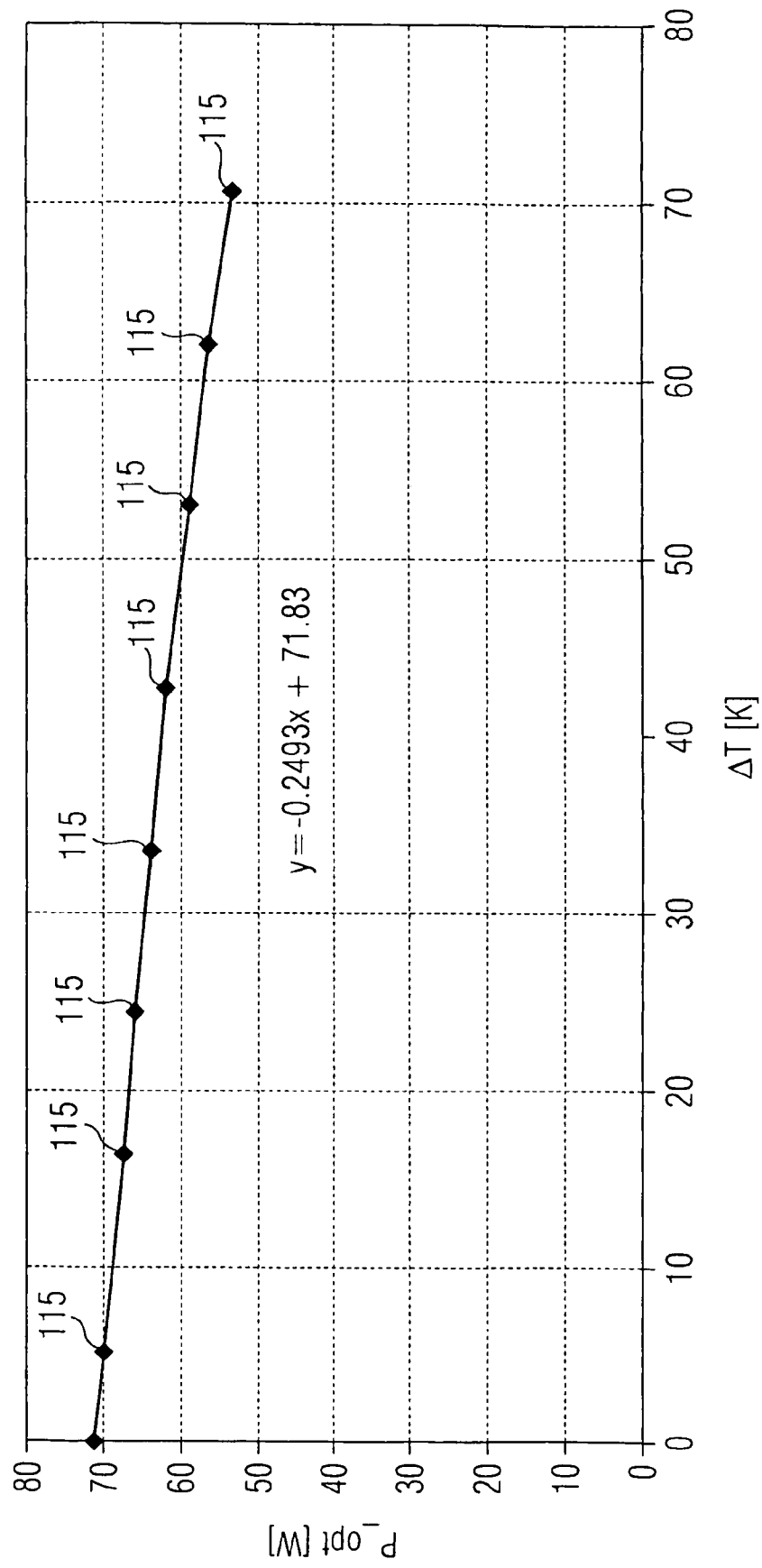
FIG. 10 shows the dependence of the optical peak power of a semiconductor laser component on the change in the operating temperature of the semiconductor laser component.

FIG. 10 shows the dependence of the optical peak power of the semiconductor laser component P_opt in watts on the change ΔT in the operating temperature of the semiconductor laser component in kelvins relative to room temperature. It can be seen that the optical peak power of the semiconductor laser component decreases essentially linearly as the temperature rises. A best fit straight line for the data points 115 corresponding to the measured peak powers results as $$y=-0.2493 \cdot x+71.83$$

The decrease in the optical peak power as the temperature rises accordingly amounts to approximately −0.25 W/K.

Figure 11:
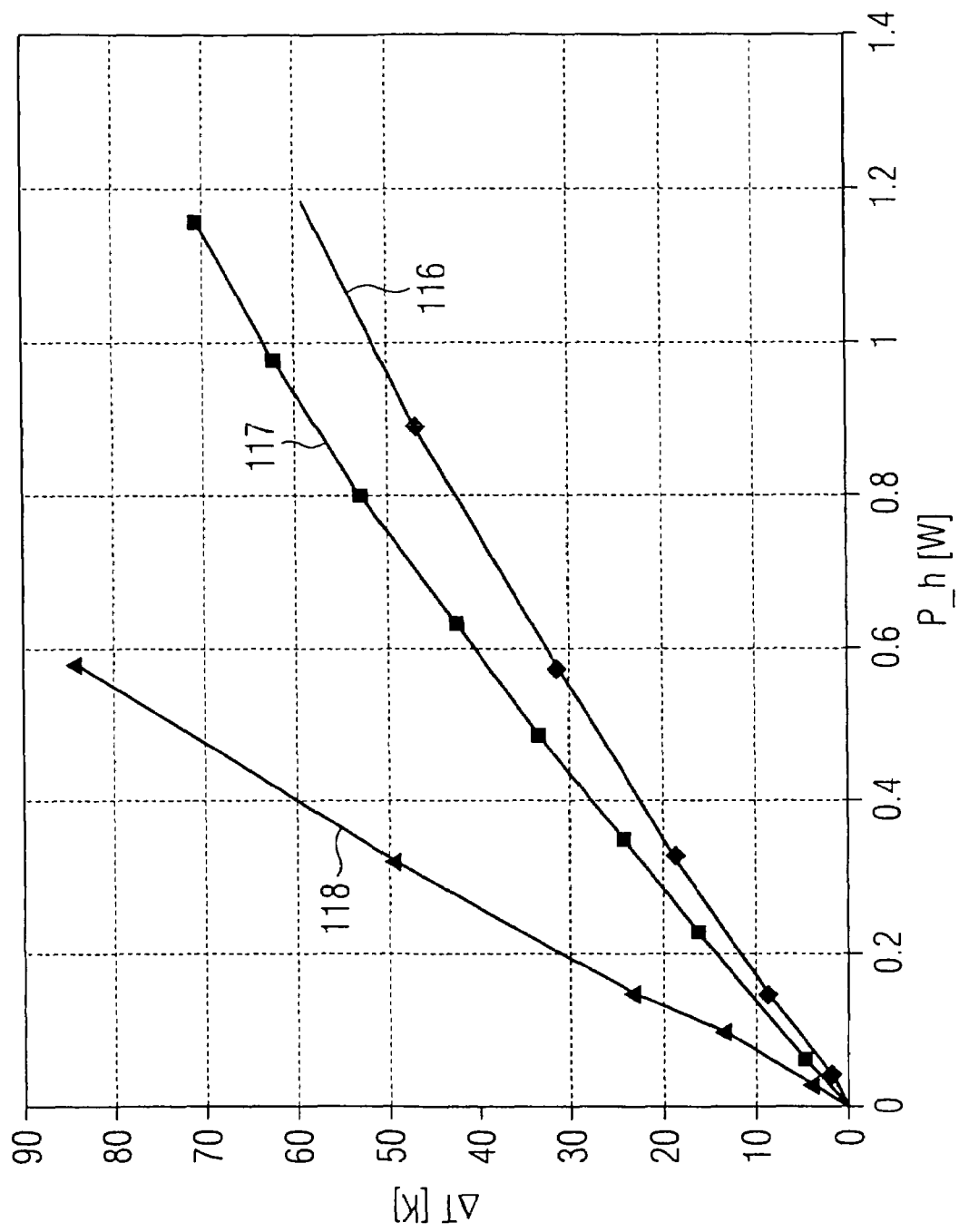
FIG. 11 shows a comparison of the temperature change ΔT in the operating temperature of the semiconductor laser component as a function of the heating power for a semiconductor laser component heated by various methods.

FIG. 11 shows a comparison of the temperature change ΔT of the semiconductor laser component in kelvins as a function of the heating power P_h in watts for a semiconductor laser component that is heated in various ways. For the curve 116, the semiconductor laser component was heated by means of two discrete heating resistors (in accordance with FIG. 2A each having 56 Ω), for the curve 117 it was heated by means of a heating resistance layer integrated in the carrier (in accordance with FIG. 6 having a resistance of 65 Ω at room temperature) and for the curve 118 it was heated by means of two heating resistors arranged between the semiconductor laser component and the carrier (in accordance with FIG. 4 each having 56 Ω). A heating resistance region integrated in the submount was simulated by means of the latter variant.

FIG. 11 reveals that, in the curve 118, comparatively small heating powers bring about comparatively high temperature changes (approximately: 85 K at 0.58 W heating power compared with 70 K at 1.2 W in curve 117 and 60 K at 1.2 W in curve 116). A partial fit curve results for the curve 116 as $$y=-10.536 \cdot x^2+62.039 \cdot x$$

for the curve 117 as $$y=-12.761 \cdot x^2+75.74 \cdot x$$

and for the curve 118 as $$y=-39.48 \cdot x^2+169.64 \cdot x$$

A heating resistance region integrated in the submount is accordingly particularly suitable for heating the semiconductor component, but is also associated with comparatively high outlay and costs.

Heating by means of a heating resistance layer is more cost-effective by comparison therewith, discrete heating resistors being cost-effective and being able to be handled in a particularly simple manner. In particular, SMD heating resistors can be integrated into the device in a particularly simple manner by means of surface mounting.

FIG. 12 shows a comparison of the temperature determination of the operating temperature of the semiconductor laser component, heated with the heating power P_h by means of two heating resistors arranged between carrier and semiconductor laser component, using the known temperature dependence of the peak wavelength, on the one hand, and using a 1 kΩ NTC thermistor arranged at a distance from the semiconductor component (see the explanations with respect to FIG. 9) as temperature sensor, on the other hand. The temperature change ΔT relative to room temperature is in each case plotted as a function of the heating power. The curve 119 of the temperature change determined by means of the NTC thermistor deviates considerably from the curve 120 determined by means of the peak wavelength. The temperature change determined by means of the peak wavelength is greater than the temperature change determined by means of the NTC thermistor. The temperature determined by means of the peak wavelength corresponds approximately to the operating temperature and the temperature determined by means of the NTC thermistor corresponds to the ambient temperature to an intensified extent. A closely adjacent arrangement of the heating resistors with respect to the semiconductor laser component accordingly results in extremely efficient heating. A best fit straight line for the curve 119 results as $$y=80.546 \cdot x$$

and for the curve 120 results as $$y=149.95 \cdot x$$

FIG. 13 shows the thermal transient behavior of the semiconductor laser component for the above three heating variants on the basis of the dependence of the operating temperature T_b (normalized to 1) of the semiconductor laser component in arbitrary units on the heating time T_h of the semiconductor laser component in seconds. The curve 121 corresponds to the variant in accordance with FIG. 4 with two heating resistors arranged between the semiconductor laser component and the carrier, the curve 122 corresponds to the variant with the heating resistance layer integrated in the carrier in accordance with FIG. 6, and the curve 123 corresponds to the variant with the two discrete heating resistors in accordance with FIG. 2A. For all three variants, the operating temperature reaches the maximum value after approximately 100 s, which corresponds to reaching thermal equilibrium between the heating element, the surroundings and the semiconductor laser component.

The thermal time constant τ, after which the operating temperature of the semiconductor laser component amounts to half of its maximum temperature, lies between, in each case inclusively, approximately 20 s and approximately 25 s for the three variants.

The scope of protection of the invention is not limited to the examples given herein above. The invention is embodied in each novel characteristic and each combination of characteristics, which particularly includes every combination of any features which are stated in the claims, even if this feature or this combination of features is not explicitly stated in the claims or in the examples.

We claim:

1. A device comprising:
    at least one radiation-emitting semiconductor component; and
    at least one electrical heating element which is designed for heating the semiconductor component, the at least one electrical heating element being assigned to the semiconductor component,
    wherein the semiconductor component is configured for generating radiation having a peak wavelength that varies in a fluctuation range over a predetermined ambient temperature range in which the semiconductor component is intended to be operated, and
    wherein a detector element configured for detecting the radiation emitted by the semiconductor component is assigned to the semiconductor component, the detector element is configured for detecting radiation having wavelengths in a predetermined detection range, the fluctuation range of the peak wavelength of the unheated semiconductor component includes wavelengths outside the detection range of the detector element, and the detection range of the detector element covers the fluctuation range of the peak wavelength of the heated semiconductor component.

2. The device as claimed in claim 1, wherein a width of the fluctuation range of the peak wavelength is reduced, by heating the semiconductor component by means of the heating element, from a first width of the unheated semiconductor component to a second width of the heated semiconductor component, the second width being smaller than the first width.

3. The device as claimed in claim 1, wherein a temperature sensor for monitoring the operating temperature of the semiconductor component is assigned to the semiconductor component.

4. The device as claimed in claim 3, wherein the operation of the heating element can be controlled by means of the temperature sensor.

5. The device as claimed in claim 3, wherein the temperature sensor is an NTC element.

6. The device as claimed in claim 1, wherein the semiconductor laser component is intended for pulsed operation.

7. The device as claimed in claim 1, wherein the semiconductor component is arranged on a carrier.

8. The device as claimed in claim 7, wherein the carrier is a conductor board.

9. The device as claimed in claim 7, wherein the heating element is arranged on the carrier.

10. The device as claimed in claim 1, wherein the heating element is of surface-mountable design.

11. The device as claimed in claim 1, wherein the heating element is embodied as a heating resistor.

12. The device as claimed in claim 7, wherein the heating element is integrated in the carrier.

13. The device as claimed in claim 12, wherein the carrier has a multilayer structure and the heating element is integrated as heating resistance layer in the multilayer structure.

14. The device as claimed in claim 1, wherein the heating element is electrically insulated from the semiconductor component.

15. The device as claimed in claim 1, wherein the semiconductor component is arranged on the heating element.

16. The device as claimed in claim 7, wherein a submount is arranged between the carrier and the semiconductor component.

17. The device as claimed in claim 16, wherein the submount is designed as heating element or contains the heating element.

18. The device as claimed in claim 16, wherein the heating element is a heating resistance region.

19. The device as claimed in claim 18, wherein the heating resistance region is formed in the submount by means of implantation.

20. The device as claimed in claim 16, wherein the submount contains a semiconductor material.

21. The device as claimed in claim 1, wherein the semiconductor component is intended for being operated in an ambient temperature range comprising temperatures less than and greater than 0° C., in particular from −40° C. to 85° C.

22. The device as claimed in claim 21, wherein the operating temperature of the semiconductor component is at temperatures in the range greater than 0° C., in particular in the range of from 20° C. to 85° C.

23. A method for temperature stabilization of an operating temperature of a radiation-emitting semiconductor component, comprising:
    assigning an electrical heating element to the semiconductor component; and
    heating the semiconductor component when the operating temperature of the semiconductor component falls below a predetermined desired value of said operating temperature, and
    wherein the semiconductor component is configured for generating radiation having a peak wavelength that varies in a fluctuation range over a predetermined ambient temperature range in which the semiconductor component is intended to be operated, and
    wherein a detector element configured for detecting the radiation emitted by the semiconductor component is assigned to the semiconductor component, the detector element is configured for detecting radiation having wavelengths in a predetermined detection range, the fluctuation range of the peak wavelength of the unheated semiconductor component includes wavelengths outside the detection range of the detector element, and the detection range of the detector element covers the fluctuation range of the peak wavelength of the heated semiconductor component.

24. The method as claimed in claim 23, wherein when the predetermined desired value of the operating temperature of the semiconductor component is exceeded, the heating power of the heating element is reduced or the heating element is switched off.

25. The method as claimed in claim 23, wherein the semiconductor component is designed for generating radiation having a peak wavelength that varies in a fluctuation range over a predetermined ambient temperature range in which the semiconductor component is intended to be operated.

26. The method as claimed in claim 25, wherein a width of the fluctuation range of the peak wavelength is reduced, by heating the semiconductor component by means of the heating element, from a first width of the unheated semiconductor component to a second width of the heated semiconductor component, the second width being smaller than the first width.

27. The method as claimed in claim 23, wherein the operating temperature of the semiconductor component is monitored by means of a temperature sensor assigned to the semiconductor component.

28. The method as claimed in claim 27, wherein the operation of the heating element is controlled by means of the temperature sensor.

29. The device as claimed in claim 1, further comprising a plurality of surface mountable heating elements.

30. The device as claimed in claim 1, further comprising a plurality of surface mountable heating resistors.

31. The device as claimed in claim 1, wherein the semiconductor component comprises a semiconductor laser component.

32. The device as claimed in claim 1, wherein the semiconductor component comprises one of a VCSEL, a VECSEL, and a laser diode bar.

* * * * *